(12) United States Patent
Dortu

(10) Patent No.: US 7,009,902 B2
(45) Date of Patent: Mar. 7, 2006

(54) SEMICONDUCTOR MEMORY HAVING A FIRST AND SECOND SENSE AMPLIFIER FOR SENSING A MEMORY CELL VOLTAGE DURING A NORMAL MODE AND A REFRESH MODE

(75) Inventor: Jean-Marc Dortu, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/063,495

(22) Filed: Feb. 22, 2005

(65) Prior Publication Data

US 2005/0195670 A1   Sep. 8, 2005

(30) Foreign Application Priority Data

Feb. 19, 2004  (DE) ............... 10 2004 008 152

(51) Int. Cl.
  *G11C 7/06*  (2006.01)

(52) U.S. Cl. .............. 365/208; 365/207; 365/222; 365/196; 365/227

(58) Field of Classification Search ........... 365/196, 365/195, 222, 207, 208, 227
See application file for complete search history.

(56) References Cited

U.S. PATENT DOCUMENTS

| | | | | |
|---|---|---|---|---|
| 4,811,302 A | * | 3/1989 | Koishi | 365/222 |
| 5,731,718 A | | 3/1998 | Rieger | 327/51 |
| 6,452,854 B1 | * | 9/2002 | Kato et al. | 365/226 |
| 2002/0027234 A1 | * | 3/2002 | Kato et al. | 257/207 |

FOREIGN PATENT DOCUMENTS

DE    195 36 486 C2    8/1997

OTHER PUBLICATIONS

German Patent Office Examination Report dated Dec. 10, 2004.

* cited by examiner

*Primary Examiner*—Andrew Q. Tran
(74) *Attorney, Agent, or Firm*—Patterson & Sheridan, L.L.P.

(57) ABSTRACT

Semiconductor memory apparatus and methods of operating the same are provided. The apparatus has at least one first sense amplifier for amplifying a voltage level which has been read from a memory cell when the semiconductor memory apparatus is in an active operating mode and at least one second sense amplifier for amplifying a voltage level which has been read from the memory cell when the semiconductor memory apparatus is in a refresh operating mode. The apparatus is designed such that either the first or the second sense amplifier can be placed in electrical contact with the memory cell and the capacitance of the second sense amplifier is lower than the capacitance of the first sense amplifier.

20 Claims, 5 Drawing Sheets

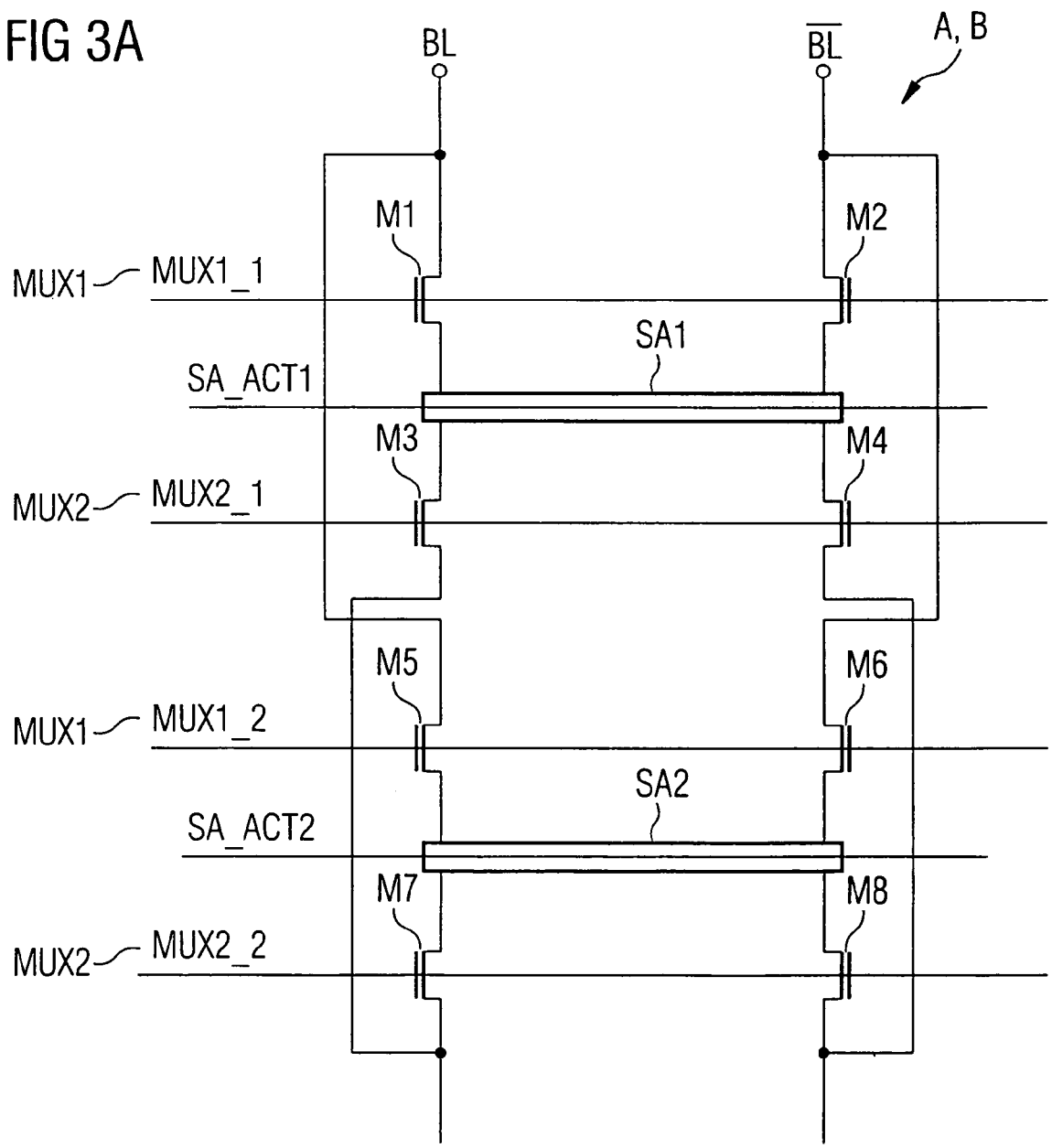

SEMICONDUCTOR MEMORY HAVING A FIRST AND SECOND SENSE AMPLIFIER FOR SENSING A MEMORY CELL VOLTAGE DURING A NORMAL MODE AND A REFRESH MODE

CROSS-REFERENCE TO RELATED APPLICATIONS

This application claims foreign priority benefits under 35 U.S.C. §119 to co-pending German patent application number 10 2004 008 152.2, filed 19 Feb. 2004. This related patent application is herein incorporated by reference in its entirety.

BACKGROUND OF THE INVENTION

1. Field of the Invention

The present invention relates to a semiconductor memory apparatus and to a method for operating a semiconductor memory apparatus.

2. Background

With the greatly increasing use of semiconductor memory apparatuses in devices which are not connected to main power supplies (e.g., electrical outlets) or which are operated by battery, the power consumption of the semiconductor memory apparatus has been found to be a critical factor for the respective period of use of the devices.

It is thus an object of the present invention to provide a semiconductor memory apparatus and a method for operating a semiconductor memory apparatus at reduced power consumption.

SUMMARY OF THE INVENTION

The invention provides a semiconductor memory apparatus and method of operating the same.

One embodiment provides a semiconductor memory apparatus. The apparatus generally includes a matrix of memory cells which can be addressed via word lines and bit lines, at least one first sense amplifier for amplifying a voltage level which has been read from a memory cell when the semiconductor memory apparatus is in an active operating mode, and at least one second sense amplifier for amplifying a voltage level which has been read from the memory cell when the semiconductor memory apparatus is in a refresh operating mode. Either the first or the second sense amplifier can be placed in electrical contact with the memory cell, and the capacitance of the second sense amplifier is lower than the capacitance of the first sense amplifier.

Another embodiment provides a method for operating a semiconductor memory apparatus. The method generally includes amplifying a voltage level which has been read from a memory cell in the semiconductor memory apparatus using a first sense amplifier when the semiconductor memory apparatus is in an active operating mode and amplifying a voltage level which has been read from the memory cell using a second sense amplifier when the semiconductor memory apparatus is in a refresh operating mode. A capacitance of the second sense amplifier is lower than the capacitance of the first sense amplifier.

Another embodiment provides a semiconductor memory apparatus. The apparatus generally includes a plurality of memory cells addressable via word lines and bit lines, at least one first sense amplifier for amplifying a voltage level which has been read from a memory cell when the semiconductor memory apparatus is in an active operating mode, at least one second sense amplifier for amplifying a voltage level which has been read from the memory cell when the semiconductor memory apparatus is in a refresh operating mode, the second sense amplifier having lower associated capacitance than the first sense amplifier, and switching circuitry to place either the first sense amplifier in electrical contact with the memory cell, depending on whether the device is in an active operating mode or a refresh operating mode.

BRIEF DESCRIPTION OF THE DRAWINGS

Further features, objects and advantages of the present invention will become obvious from the subsequent detailed description of a preferred embodiment with reference to the drawings, in which:

FIG. 3A shows a schematic view of a portion of a strip-like region shown in FIG. 1;

DETAILED DESCRIPTION OF THE PREFERRED EMBODIMENT

Figure 1:
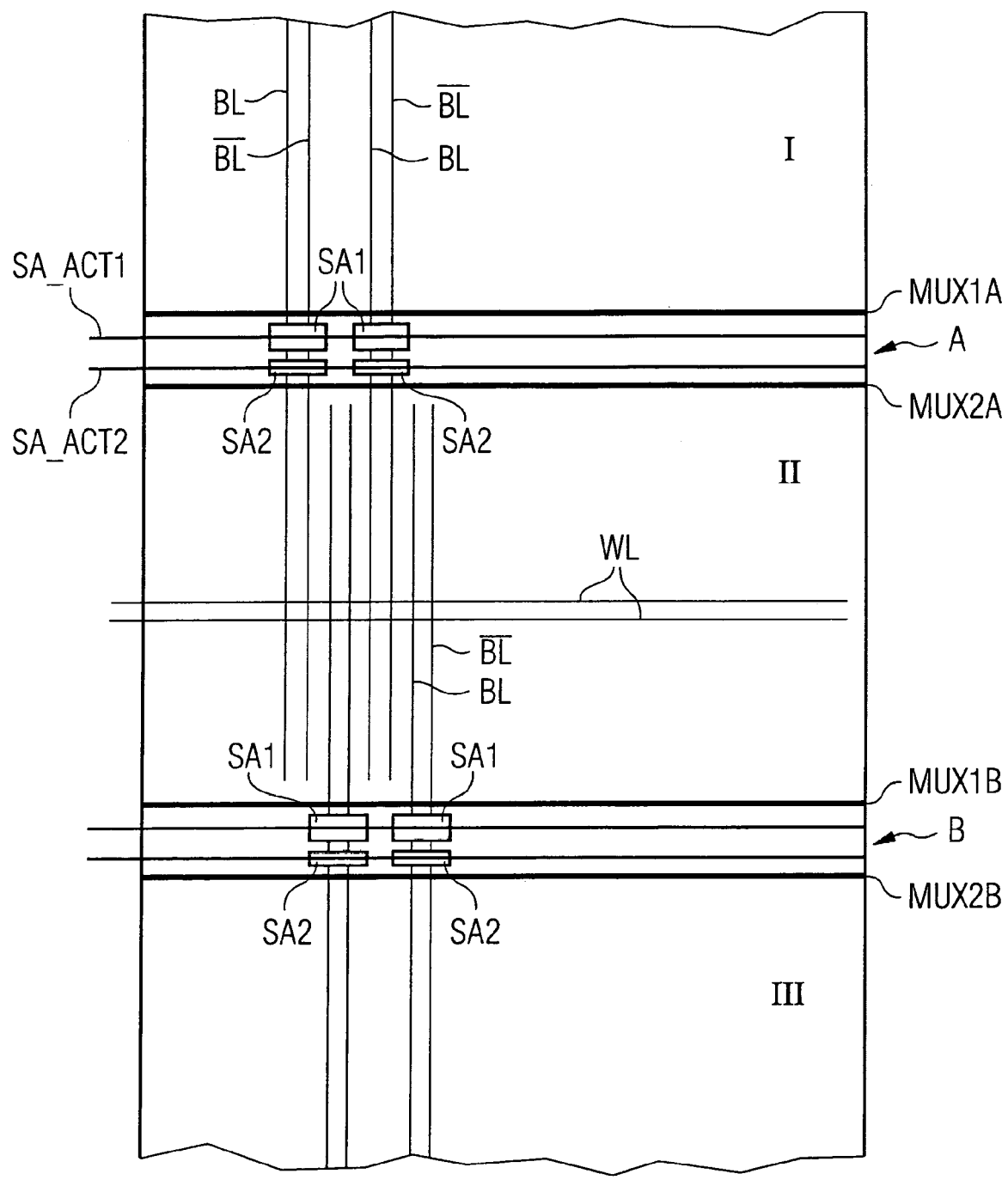
FIG. 1 shows a schematic partial view of a semiconductor memory apparatus based on a preferred embodiment of the present invention.

FIG. 1 shows a schematic partial view of a semiconductor memory apparatus based on a preferred embodiment of the present invention.

The semiconductor memory apparatus comprises a multiplicity of memory cells (not shown) which are arranged in the manner of a matrix and can be addressed via word lines WL and bit lines BL. FIG. 1 shows a few bit lines BL and word lines WL merely by way of example. In the preferred embodiment, a multiplicity of word lines WL are arranged so as to run parallel to one another. In addition, a multiplicity of bit lines BL running parallel to one another are provided which run at right angles to the word lines WL. The memory cells are respectively arranged, in particular, at crossover points between a word line WL and a bit line BL.

In the embodiment shown, the memory cells arranged in the manner of a matrix are split into a plurality of regions or arrays I, II, and III. Respectively arranged between two regions I, II, and III and running parallel to the word lines WL are a multiplicity of first sense amplifiers SA1 and second sense amplifiers SA2. In particular, the sense amplifiers SA1, SA2 are arranged in a strip-like region A, B between two respective adjacent regions I, II, and III.

A first sense amplifier SA1 and a second sense amplifier SA2 can respectively be placed in electrical contact preferably with two respective bit lines or a bit line pair BL, /BL from adjoining regions I to II. A bit line pair BL, /BL preferably comprises a bit line BL and the inverse of this bit line /BL (i.e., a bit line on which a signal which is the inverse of the signal on the bit line BL is generated or present). The first and second sense amplifiers SA1 and SA2 differ from one another by virtue of the sense amplifier SA1, as described later in detail, having a higher capacitance than the sense amplifier SA2. In this context, the capacitance of a sense amplifier is, in particular, the sum of the capacitances of the gates of the sense amplifier which are connected to the bit lines (as described later with reference to FIG. 2).

Essentially all first sense amplifiers SA1 in a strip-like region A, B are connected via a line SA_ACT1 to a signal input (not shown) on the semiconductor memory apparatus, via which input an activation signal for the first sense amplifiers SA1 can be transmitted. Similarly, essentially all second sense amplifiers SA2 in a strip-like region A, B are connected via a line SA_ACT2 to a signal input on the semiconductor memory apparatus, via which input an activation signal for the second sense amplifiers SA2 can be transmitted. During operation of the semiconductor memory apparatus, the activation signals are controlled such that respectively either only the first sense amplifiers SA1 or the second sense amplifiers SA2 are placed in electrical contact with the respective bit line or the respective bit line pair BL, /BL such that signal transmission is possible.

Between the sense amplifiers SA1, SA2 and the regions I, II, III which adjoin them the strip-like regions A and B respectively contain a row of multiplexers or multiplexer devices MUX1A, MUX2A and MUX1B, MUX2B. The multiplexer devices MUX1A, MUX2A and MUX1B, MUX2B are switched during operation such that the respective active sense amplifier SA1 or SA2 is electrically connected for signaling purposes to one of the two regions I, II, III which adjoin it.

Figure 2:
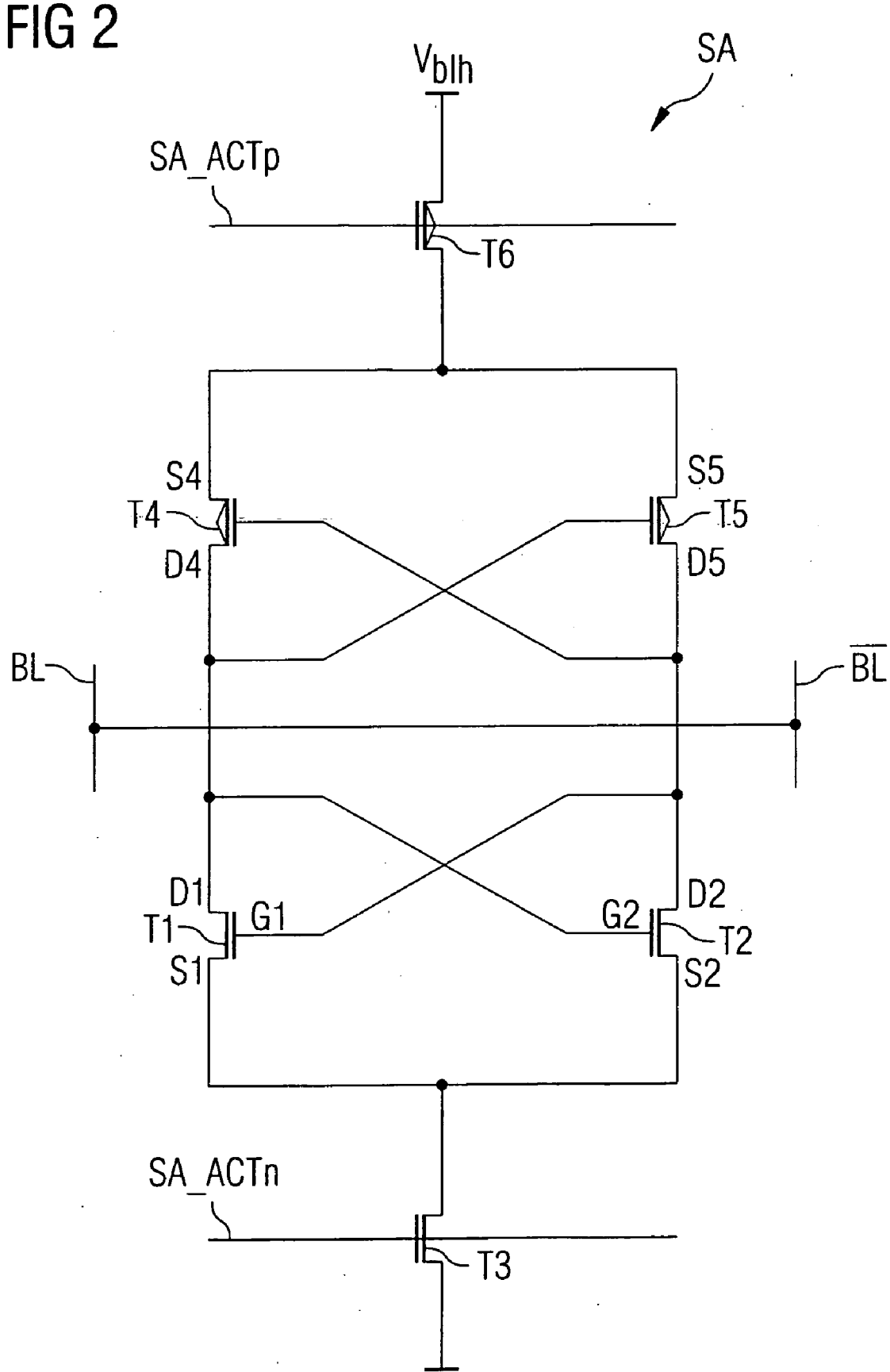
FIG. 2 shows a schematic view of a preferred embodiment of a sense amplifier used in the semiconductor memory apparatus from FIG. 1.

FIG. 2 schematically shows a preferred embodiment of the sense amplifiers SA1, SA2 used in the semiconductor memory apparatus.

The gate connections G1 and G2 of two N-FET transistors T1 and T2 are respectively electrically connected to the drain connections D2 and D1 of the other transistors T2 and T1. The source connections S1 and S2 of the transistors T1 and T2 are grounded via a further N-FET transistor T3. The transistor T3 is controlled by means of a signal SA_ACTn (i.e., SA_ACT1 or SA_ACT2 for T3 of SA1 or SA2, respectively).

An identical design containing P-FET transistors T4, T5, T6 is likewise provided, with a transistor T6 being controlled by the signal SA_ACTp and being connected not to ground but rather to a predetermined voltage or to the bit line voltage or array voltage $V_{b1h}$. The drain connections D1 of the transistor T1 and D4 of the transistor T4 are electrically connected to the bit line BL. In addition, the drain connections D2 of the transistor T2 and D5 of the transistor T5 are connected to the inverse of the bit line /BL. The transistors T2 and T5 are thus controlled by the signal which is on the bit line BL, and the transistors T1 and T4 are controlled by the inverse of the bit line signal. In this context, the signals SA_ACTn and SA_ACTP are signals which respectively correspond either to the signal SA_ACT1 or to the signal SA_ACT2. In this case, the signals SA_ACT1, 2 may be split into two signals SA_ACTn and SA_ACTp, or two separate signals SA_ACTn and SA_ACTp may be respectively generated.

The capacitance of the sense amplifier shown is thus the sum of the capacitances of gates G1 and G4, which are connected to the inverse of the bit line /BL, and G2 and G5, which are connected to the bit line BL.

The sense amplifiers SA1 and SA2 essentially have the design shown in FIG. 2, with the transistors in the first sense amplifier SA1 being of larger design than the transistors in the second sense amplifier SA2. In particular, the physical size or gate width of the transistors T1 to T6 is greater in the case of the first sense amplifiers SA1 than in the case of the second sense amplifiers SA2. The gate width W is, in particular, the spatial extent of the gate at right angles to the gate length L, which extends between the source and drain.

FIG. 3A shows a schematic view of a portion of the strip-like region A, B which is shown in FIG. 1. For the sake of clarity, the sense amplifiers SA1, SA2 are shown merely schematically.

The design of the multiplexer devices MUX1A, MUX2A and MUX1B, MUX2B in the strip-like regions A, B is essentially the same, which means that there is no distinction drawn between the strip-like regions A and B in the text below.

The multiplexer device MUX1 comprises respective multiplexers MUX1_1 and MUX1_2 in order to allow a signal connection between the sense amplifier SA1 and a bit line pair BL, /BL in the selected region I, II or III. Similarly, the multiplexer device MUX2 comprises respective multiplexers MUX2_1 and MUX2_2 in order to allow a signal connection between the sense amplifier SA2 and a bit line pair BL, ¬BL in the selected region I, II or III. The multiplexers MUX1_1, MUX1_2, MUX2_1 and MUX2_2 preferably comprise transistors M1-M8 which are respectively arranged as illustrated in the electrical signal path between the respective sense amplifier SA1, SA2 and a bit line BL, /BL.

Thus, by way of example, the multiplexer MUX1_1 comprises the transistors M1 and M2, which are arranged in the electrical path between the sense amplifier SA1 and the region of the memory cell array which (region) is arranged at the top in FIG. 3A or the bit lines BL, /BL which are provided in this region. The multiplexer MUX2_1 comprises the transistors M3 and M4, which are arranged in the electrical path between the sense amplifier SA1 and the region of the memory cell array which (region) is arranged at the bottom in FIG. 3A or the bit lines BL, /BL which are provided in this region. It is thus possible for the transistors M1–M4 to be controlled or switched appropriately in order to properly select which region of the memory cell array has a signaling connection to sense amplifier SA1. A design which is essentially the same with the transistors M5-M8 is provided for the sense amplifier SA2.

The signal paths which are formed by the transistors M1 and M3 and the sense amplifier SA1 or by the transistors M5 and M7 and the sense amplifier SA2 are parallel to one another. Similarly, signal paths which are formed by the transistors M2 and M4 and the sense amplifier SA1 or by the transistors M6 and M8 and the sense amplifier SA2 are parallel to one another. By controlling or switching the transistors M1–M8 as appropriate, it is possible to achieve a situation in which just one of the two sense amplifiers SA1 and SA2 in the signal path to the memory cells is active. This prevents the respective sense amplifier which is not currently being used from acting on the bit line as a load. In addition, the transistors in a multiplexer may be controlled in the same way, such that either a signaling connection between the active sense amplifier and the selected bit line pair BL, /BL is permitted or not.

Various examples of actuation options for the multiplexers is described below.

EXAMPLE 1

In the active operating mode, the region of the memory cell array which is at the bottom in FIG. 3A needs to be read. It is therefore necessary to use sense amplifier SA1, which needs to have a signaling connection to the region of the memory cell array which is at the bottom in FIG. 3A. For this, the multiplexer MUX2_1 is actuated with "1", as a result of which the transistors M3 and M4 turn on and set up a signaling connection. On the other hand, the transistors of the other multiplexers MUX1_1, MUX2_1 and MUX2_2 are turned off (e.g., transistors M1–M2, M5–M6, and M7–M8 are driven with a "0").

EXAMPLE 2

In the refresh operating mode, the region of the memory cell array which is at the bottom in FIG. 3A needs to be read. It is thus necessary to use sense amplifier SA2, which needs to have a signaling connection to the region of the memory cell array which is at the bottom in FIG. 3A. For this, the multiplexer MUX2_2 is actuated with "1", as a result of which the transistors M7 and M8 turn on and set up a signaling connection. On the other hand, the transistors of the other multiplexers MUX1_1, MUX1_2, and MUX2_1 are turned off (e.g., transistors M1–M2, M3–M4, and M5–M6 are driven with a "0").

To address the memory cell region which is at the top in FIG. 3A, the multiplexers from the respective multiplexers MUX1_1 (in the active mode) and MUX1_2 (in the refresh mode) are actuated with "1" and, in both cases, the respective transistors of the remaining multiplexers are turned off.

Hence, precisely one multiplexer is always actuated with "1" and the remaining multiplexers are turned off.

Figure 3B:
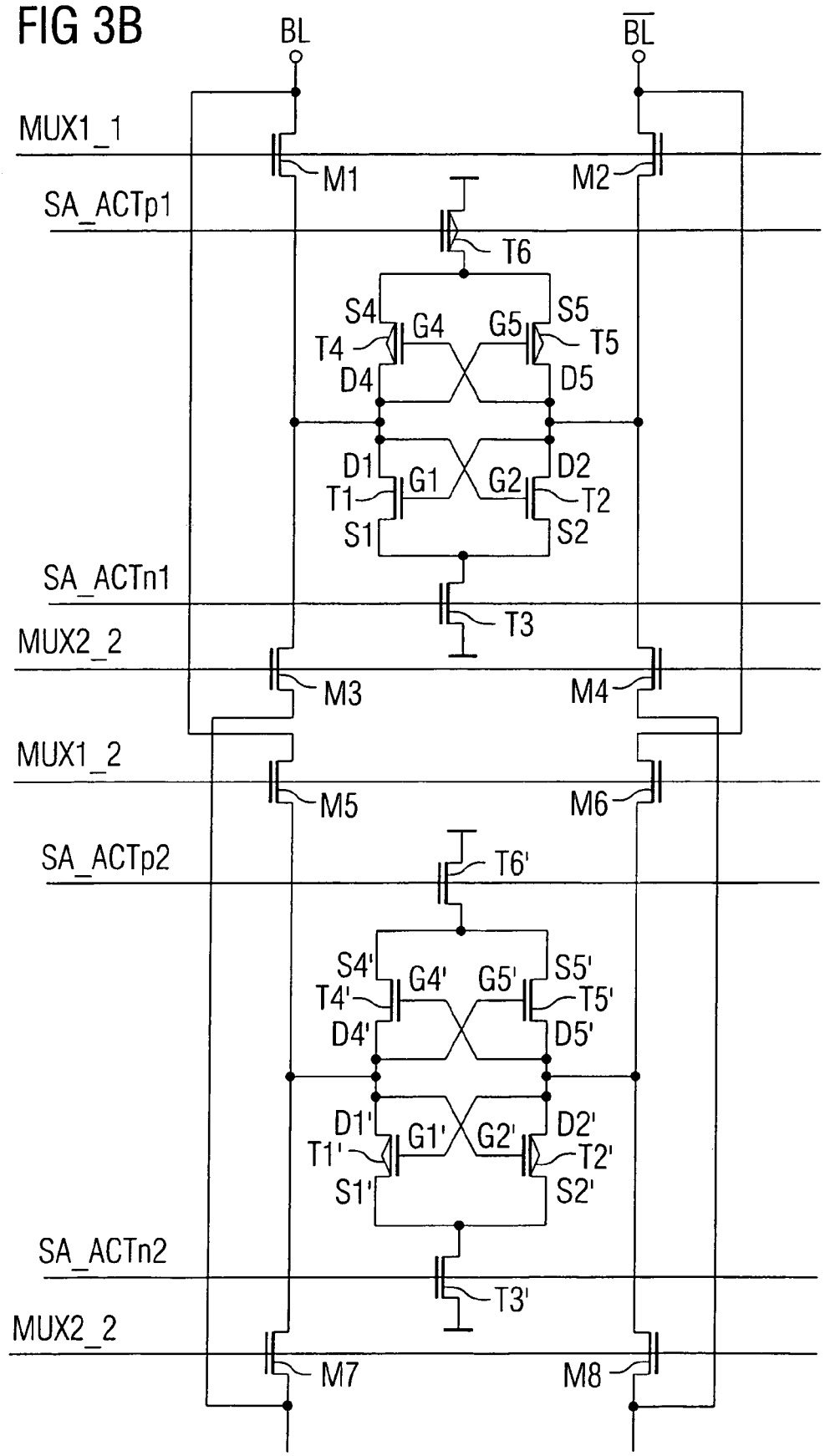
FIG. 3B shows a detailed view of the portion of the strip-like region shown in FIG. 3A.

FIG. 3B shows a detailed view of that portion of the strip-like region which is shown in FIG. 3A, the sense amplifiers SA1, SA2 being shown in detail in FIG. 2.

Considerations which resulted in the present invention found that the current $I_{blh}$ required during a self-refresh in the semiconductor memory apparatus can be shown using the following equation:

$$I_{blh} = V_{blh} * (C_{sa} + C_{bl}) * \text{freq} \qquad \text{(Equation 1)}$$

where $I_{blh}$=bit line current, $V_{blh}$=maximum bit line voltage or maximum voltage on the bit line, $C_{sa}$=sense amplifier capacitance, $C_{bl}$=bit line capacitance, and freq=self-refresh frequency.

The bit line voltage $V_{blh}$ and the self-refresh frequency freq are essentially unalterable (e.g., are determined by design parameters of the memory cell arrays). However, the bit line current $I_{blh}$ can be reduced by reducing the sense amplifier capacitance $C_{sa}$ and/or the bit line capacitance $C_{bl}$.

The sense amplifier capacitance $C_{sa}$ is essentially proportional to the size of the sense amplifier. In addition, the time T which is required to change over the capacitive load of a bit line using a sense amplifier is inversely proportional to the capacitance or dimensioning of the sense amplifier. This means that the lower the capacitance of the sense amplifier, the longer a read operation and/or write operation takes. The smaller the sense amplifier, the longer the time which is needed in order to read information stored in a memory cell and to write it back to the memory cell.

In the active operating mode of the semiconductor memory apparatus, the upper limit of the time T is set by the clock rate of the semiconductor memory apparatus. This means that the time T cannot exceed a predetermined value. It is thus necessary for the sense amplifiers to be provided with larger dimensions for the active operating mode and therefore to have a higher capacitance.

However, if the semiconductor memory apparatus is in the self-refresh mode, the restriction for the time T is more generous, i.e. T can be longer. It is thus possible to use sense amplifiers in the self-refresh mode which have smaller dimensions and therefore have a lower capacitance. As a result, the power consumption can be reduced during the self-refresh.

Figure 4A:
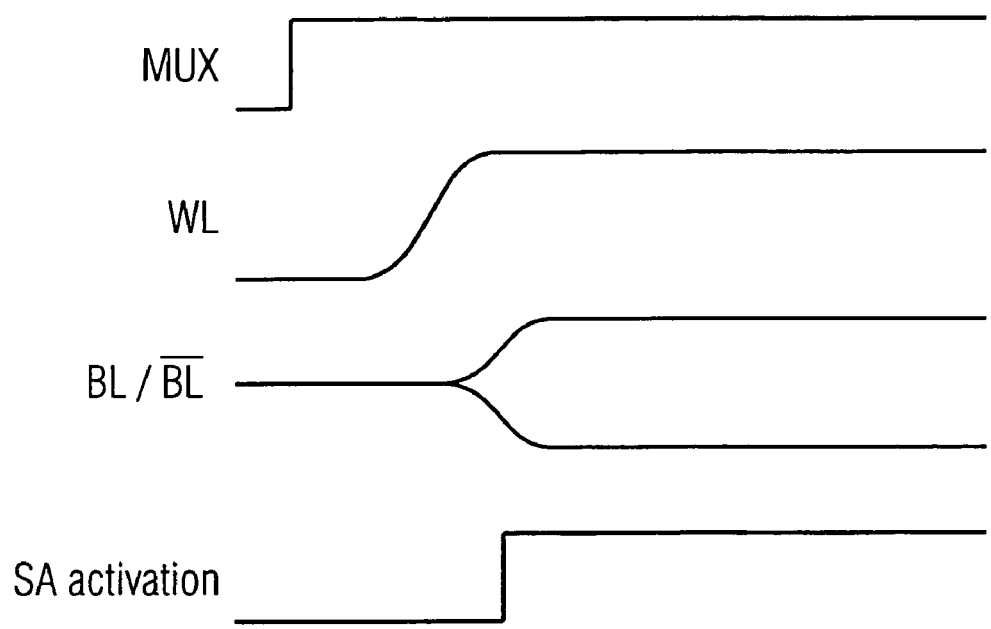
FIG. 4A shows a signal flowchart when the semiconductor memory apparatus is in the active operating mode.
Figure 4B:
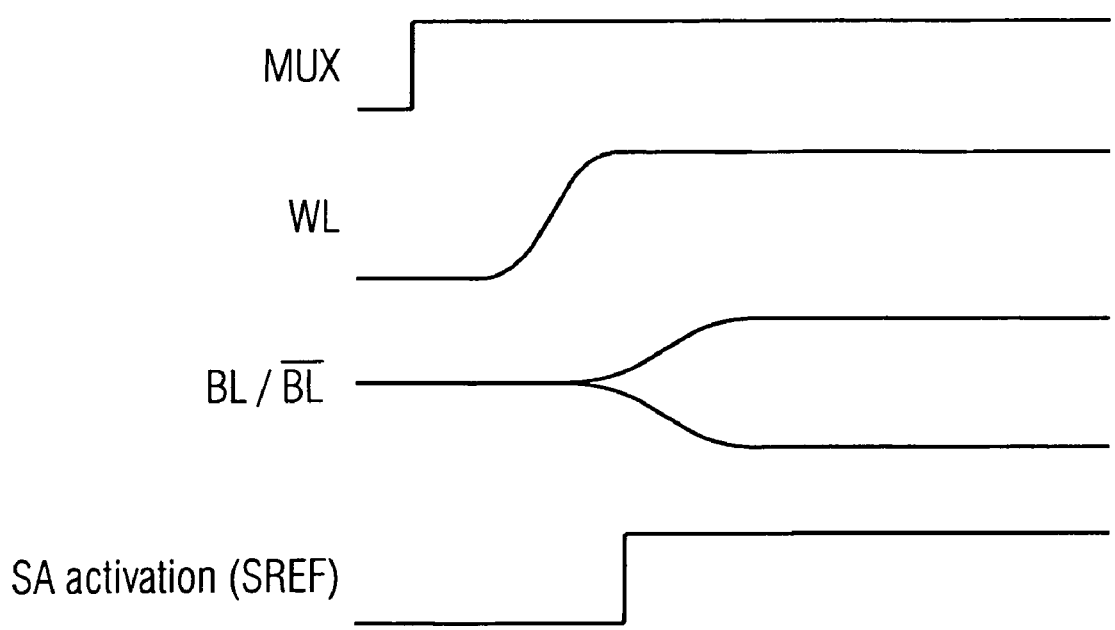
FIG. 4B shows a signal flowchart when the semiconductor memory apparatus is in a self-refresh operating mode.

The text below describes the operation of a semiconductor memory apparatus, in accordance with one embodiment of the present invention, with reference to FIGS. 4A, 4B and 1. FIGS. 4A and 4B show signal diagrams during the operation of the semiconductor memory apparatus in the active operating mode and in the self-refresh operating mode, respectively.

First, the operation of the semiconductor memory apparatus in the active operating mode is described with reference to FIG. 4A. As previously described, the active operating mode of the semiconductor memory apparatus is, in particular, an operating mode in which read and write instructions are executed, for example. For this example, it is assumed that a read instruction has been previously transmitted to the semiconductor memory apparatus.

If a read instruction needs to be executed, the multiplexers MUX1A, MUX1B, MUX2A, MUX2B are first used to select that region I, II, III of the memory cell array in the semiconductor memory apparatus which contains the memory cell or memory cells which is targeted by the read instruction. If the targeted memory cells are in the region II, for example, the multiplexers MUX1B and MUX2A in the strip-like regions A and B are switched such that a signaling connection is permitted between the sense amplifiers SA1, SA2 which adjoin them and the memory cells which are in the region II. At the same time, the multiplexers MUX1A and MUX2B are switched such that signal transmission to memory cells in the regions I and III is not permitted.

As can be seen in FIG. 4A, the corresponding multiplexer signal MUX is thus set to "high" in order to permit signal transmission. The word line in the corresponding memory cell which is to be read is then activated and likewise changes to the "high" state. As soon as the word line WL has been activated, the information contained in the memory cell is put onto the corresponding bit lines BL and /BL. After a predetermined period of time, the sense amplifier SA1 is activated by means of the signal SA activation via the line SA_ACT1. The signal is subsequently amplified on the bit line. In the present case, the information contained in the memory cell needs to be read quickly. For this reason, the first sense amplifier SA1 is used.

The operation of the semiconductor memory apparatus in the self-refresh mode is now described with reference to FIG. 4B.

As in the case above, the multiplexer signal MUX and the word line WL are activated. As soon as the word line WL has been activated, the information contained in the memory cell is put onto the corresponding bit lines BL and /BL. After a predetermined period of time, the sense amplifier SA2 is activated by means of the signal SA activation (SREF) via the line SA_ACT2. The signal which has been read from the memory cell and is present on the bit line is amplified and is written back to the memory cell. In this case, however, the period of time which is needed in order to amplify the signal is longer than in the active operating mode. This is indicated by the shallower rising curve for the signals on BL and /BL in FIG. 4B.

As described above, a semiconductor memory apparatus is proposed in which a first and a second sense amplifier are provided essentially for each bit line or each bit line pair. The first sense amplifier is used during the active operating mode of the semiconductor memory apparatus and has a larger capacitance than the second sense amplifier, which is used during the self-refresh mode. By using the second sense amplifiers in the self-refresh mode of the semiconductor memory apparatus, it is possible to reduce the power consumption of the semiconductor memory apparatus.

While the foregoing is directed to embodiments of the present invention, other and further embodiments of the invention may be devised without departing from the basic scope thereof, and the scope thereof is determined by the claims that follow.

What is claimed is:

1. A semiconductor memory apparatus, comprising:
    a matrix of memory cells which can be addressed via word lines and bit lines;

at least one first sense amplifier for amplifying a voltage level which has been read from a memory cell when the semiconductor memory apparatus is in an active operating mode; and at least one second sense amplifier for amplifying a voltage level which has been read from the memory cell when the semiconductor memory apparatus is in a refresh operating mode;

wherein, either the first or the second sense amplifier can be placed in electrical contact with the memory cell, and the capacitance of the second sense amplifier is lower than the capacitance of the first sense amplifier.

2. The semiconductor memory apparatus of claim 1, wherein at least a first and a second sense amplifier are respectively associated with a bit line of a memory cell in order to amplify the signal transmitted via the bit line.

3. The semiconductor memory apparatus of claim 1, wherein the first and second sense amplifiers each comprise one or more transistors, and the transistors in the second sense amplifier are smaller in one or more dimensions than the transistors in the first sense amplifier.

4. The semiconductor memory apparatus of claim 1, further comprising at least one signal input for receiving an activation signal for activating the first or second sense amplifier.

5. The semiconductor memory apparatus of claim 1, wherein the matrix of memory cells is arranged as at least two regions of memory cells, and at least a respective first sense amplifier and a respective second sense amplifier are associated with two regions and can be placed in electrical contact either with one region or with the other region depending on the location of memory cells to be accessed by a read or refresh operation.

6. The semiconductor memory apparatus of claim 5, wherein the first and second sense amplifiers are respectively physically located between two of the regions with which the sense amplifiers can be placed in contact.

7. The semiconductor memory apparatus of claim 5, further comprising at least one multiplexer for placing appropriate sense amplifiers in electrical contact with one of the regions.

8. A method for operating a semiconductor memory apparatus, comprising:

amplifying a voltage level which has been read from a memory cell in the semiconductor memory apparatus using a first sense amplifier when the semiconductor memory apparatus is in an active operating mode; and amplifying a voltage level which has been read from the memory cell using a second sense amplifier when the semiconductor memory apparatus is in a refresh operating mode;

wherein a capacitance of the second sense amplifier is lower than the capacitance of the first sense amplifier.

9. The method of claim 8, wherein the first and the second sense amplifier are respectively associated with a bit line of a memory cell in order to amplify the signal transmitted via the bit line.

10. The method of claim 8, wherein the first and second sense amplifiers each comprise one or more transistors, and the transistors in the second sense amplifier are smaller in one or more dimensions than the transistors in the first sense amplifier.

11. The method of claim 8, further comprising providing an activation signal on at least one signal input for activating the first or second sense amplifier.

12. The method of claim 8, wherein:

a matrix of memory cells is arranged as at least two regions of memory cells, and at least a respective first sense amplifier and a respective second sense amplifier are associated with two regions; and a method further comprises placing a respective first or second sense amplifier in electrical contact either with one region or with the other region depending on the location of memory cells to be accessed by a read or refresh operation.

13. The method of claim 12, wherein the first and second sense amplifiers are respectively physically located between two of the regions with which the sense amplifiers can be placed in contact.

14. The method of claim 12, further comprising switching a selected one or more of a plurality of multiplexers to place appropriate sense amplifiers in electrical contact with one of the regions.

15. A semiconductor memory apparatus, comprising:

a plurality of memory cells addressable via word lines and bit lines;

at least one first sense amplifier for amplifying a voltage level which has been read from a memory cell when the semiconductor memory apparatus is in an active operating mode;

at least one second sense amplifier for amplifying a voltage level which has been read from the memory cell when the semiconductor memory apparatus is in a refresh operating mode, the second sense amplifier having lower associated capacitance than the first sense amplifier; and switching circuitry to place either the first or second sense amplifier in electrical contact with the memory cell, depending on whether the device is in the active operating mode or the refresh operating mode.

16. The semiconductor memory apparatus of claim 15, wherein the first and second sense amplifiers each comprise one or more transistors, and the transistors in the second sense amplifier are smaller in one or more dimensions than the transistors in the first sense amplifier.

17. The semiconductor memory apparatus of claim 15, wherein the switching circuitry comprises a plurality of multiplexors, wherein multiplexors switched during a memory access depend on the physical location of memory cells being accessed.

18. The semiconductor memory apparatus of claim 17, wherein:

the memory cells are arranged as at least two regions of memory cells; and the plurality of multiplexors comprise multiplexors to place either one or more first sense amplifiers or one or more second sense amplifiers in electrical contact either with one region or with the other region depending on the location of memory cells to be accessed by a read or refresh operation.

19. The semiconductor memory apparatus of claim 18, wherein the first and second sense amplifiers are respectively physically located between two of the regions with which the sense amplifiers can be placed in contact.

20. The semiconductor memory apparatus of claim 15, further comprising at least one signal input for receiving an activation signal for activating the first or second sense amplifier.

* * * * *